US011011667B2

(12) United States Patent
Lee et al.

(10) Patent No.: US 11,011,667 B2
(45) Date of Patent: May 18, 2021

(54) DISPLAY PANEL WITH PHOTO SENSOR AND DISPLAY DEVICE USING THE SAME

(71) Applicant: LG Display Co., Ltd., Seoul (KR)

(72) Inventors: Dongkyu Lee, Paju-si (KR); Seungjin Yoo, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/594,318

(22) Filed: Oct. 7, 2019

(65) Prior Publication Data

US 2020/0161493 A1 May 21, 2020

(30) Foreign Application Priority Data

Nov. 16, 2018 (KR) .................. 10-2018-0141675

(51) Int. Cl.
*H01L 31/12* (2006.01)
*H01L 27/12* (2006.01)
(Continued)

(52) U.S. Cl.
CPC .............. *H01L 31/12* (2013.01); *G06F 3/042* (2013.01); *G06F 3/0412* (2013.01);
(Continued)

(58) Field of Classification Search
CPC .............. G02F 1/13338; G02F 1/1611; G02F 1/134336; G02F 1/13394; G02F 1/133528; G02F 1/1368; G02F 1/133512; G02F 1/136286; G02F 1/133514; G02F 2001/13312; G02F 2001/133302; G02F 2001/134345; G02F 2201/123; G06F 3/0418; G06F 3/03542; G06F 3/03545; G06F 3/0416; G06F 3/0421; G06F 3/0412; G06F 3/042; G06F 2203/04106; G06F 2203/04109; H01L 31/12; H01L 27/124; H01L 27/1255; H01L 27/3227; H03F 3/45475; H03F 3/087; H03F 2200/129; H03F 2203/45512; G09G 2310/0286; G09G 2360/14; G09G 2360/144;
(Continued)

(56) References Cited

U.S. PATENT DOCUMENTS

| | | | | |
|---|---|---|---|---|
| 5,721,422 A | * | 2/1998 | Bird .................. | G09G 3/20 250/208.1 |
| 6,967,611 B2 | * | 11/2005 | Atriss .................. | H03M 1/162 341/155 |

(Continued)

FOREIGN PATENT DOCUMENTS

| KR | 10-2008-0085041 A | 9/2008 |
|---|---|---|
| KR | 10-2018-0035666 A | 4/2018 |

*Primary Examiner* — Christopher E Leiby
(74) *Attorney, Agent, or Firm* — Polsinelli PC

(57) ABSTRACT

A display panel comprises a plurality of pixels into which pixel data of an input image is written; a plurality of data lines connected to the plurality of pixels; a plurality of photo sensors configured to sense light; a plurality of read-out lines connected to the plurality of photo sensors; and a plurality of gate lines connected to the pixels and the photo sensors, wherein the plurality of photo sensors comprises at least one first photo sensor to which a first bias voltage is supplied and at least one second photo sensor to which a second bias voltage different from the first bias voltage is supplied.

20 Claims, 20 Drawing Sheets

(51) Int. Cl.
*H03F 3/45* (2006.01)
*G06F 3/042* (2006.01)
*G06F 3/041* (2006.01)
*G09G 3/36* (2006.01)
*G06K 9/00* (2006.01)
*H01L 27/32* (2006.01)

(52) U.S. Cl.
CPC ........ *H01L 27/124* (2013.01); *H01L 27/1255* (2013.01); *H03F 3/45475* (2013.01); *G06K 9/0004* (2013.01); *G09G 3/3677* (2013.01); *G09G 3/3688* (2013.01); *G09G 2310/0286* (2013.01); *G09G 2360/14* (2013.01); *H01L 27/3227* (2013.01); *H03F 2200/129* (2013.01); *H03F 2203/45512* (2013.01)

(58) Field of Classification Search
CPC ............... G09G 3/3677; G09G 3/3688; G09G 2300/0809; G09G 2300/0439; G09G 2300/0842; G09G 2320/029; G09G 2320/0626; G06K 9/0004
See application file for complete search history.

(56) References Cited

U.S. PATENT DOCUMENTS

| | | | | |
|---|---|---|---|---|
| 7,423,639 | B2* | 9/2008 | Min | G09G 3/3406 345/207 |
| 8,988,360 | B2* | 3/2015 | Takahashi | G06F 3/0447 345/173 |
| 2003/0179323 | A1* | 9/2003 | Abileah | G06F 3/0488 349/24 |
| 2004/0021786 | A1* | 2/2004 | Nakamura | G06K 9/00053 348/294 |
| 2006/0261253 | A1* | 11/2006 | Arao | H01L 27/14609 250/214.1 |
| 2007/0176905 | A1* | 8/2007 | Shih | G06F 3/042 345/173 |
| 2008/0055262 | A1* | 3/2008 | Wu | G06F 3/0421 345/173 |
| 2009/0295754 | A1* | 12/2009 | Chen | G06F 3/042 345/175 |
| 2010/0013811 | A1* | 1/2010 | Ahn | G09G 3/3208 345/207 |
| 2010/0156819 | A1* | 6/2010 | Takahashi | G06F 3/0412 345/173 |
| 2011/0100728 | A1* | 5/2011 | Chen | G06F 3/044 178/18.06 |
| 2012/0050220 | A1* | 3/2012 | Liu | G06F 3/0412 345/174 |
| 2012/0056663 | A1* | 3/2012 | Oh | G06F 3/0416 327/517 |
| 2012/0056835 | A1* | 3/2012 | Choo | G09G 3/3275 345/173 |
| 2012/0113055 | A1* | 5/2012 | Liu | G01J 1/46 345/175 |
| 2012/0249943 | A1* | 10/2012 | Pai | G09G 3/3648 349/141 |
| 2014/0285472 | A1* | 9/2014 | Raynor | G06F 3/0416 345/175 |
| 2016/0227142 | A1* | 8/2016 | Lin | G06K 9/00013 |
| 2017/0207760 | A1* | 7/2017 | Werking | G01P 15/125 |
| 2018/0349666 | A1* | 12/2018 | Chen | H03F 3/45 |
| 2019/0212873 | A1* | 7/2019 | Huang | G06F 3/044 |
| 2019/0215004 | A1* | 7/2019 | Nezuka | H03F 3/45 |
| 2019/0293453 | A1* | 9/2019 | Mizuta | G01D 18/00 |
| 2020/0081576 | A1* | 3/2020 | Takada | G06F 3/0418 |
| 2020/0183539 | A1* | 6/2020 | Kang | G06F 3/04164 |
| 2020/0274505 | A1* | 8/2020 | Tomisawa | H05K 1/0204 |

* cited by examiner

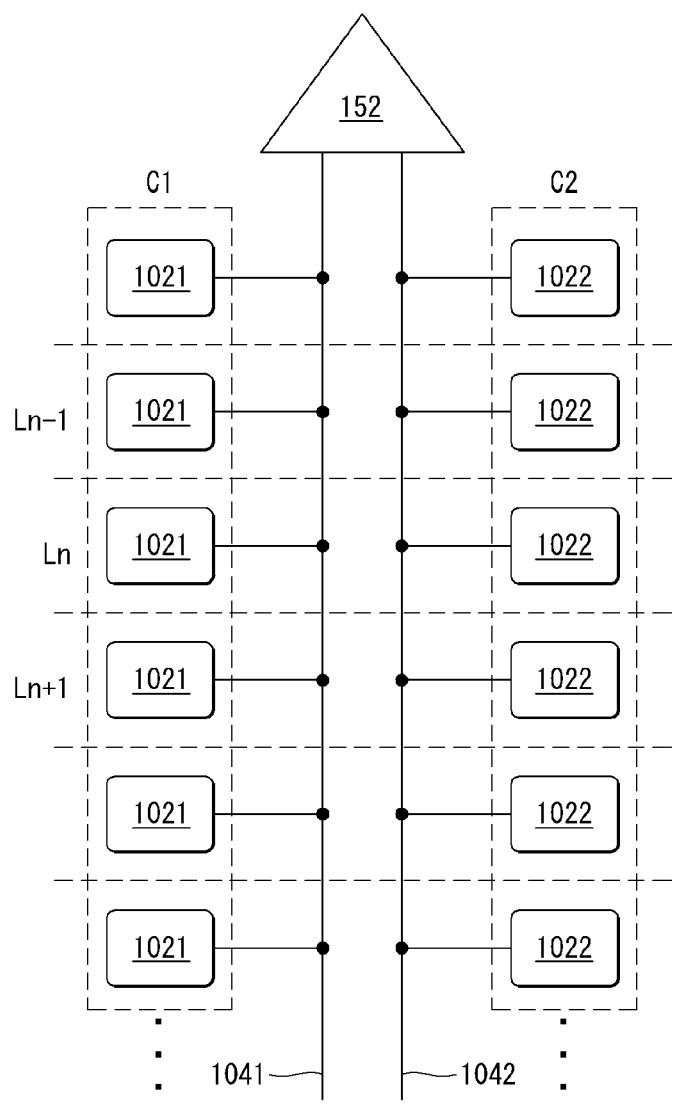

DISPLAY PANEL WITH PHOTO SENSOR AND DISPLAY DEVICE USING THE SAME

CROSS REFERENCE TO RELATED APPLICATION

This application claims the benefit of Korean Patent Application No. 10-2018-0141675 filed on Nov. 16, 2018, which is hereby incorporated by reference in its entirety.

BACKGROUND

Field of the Disclosure

The present disclosure relates to a display device having a touch sensor, and more particularly, to a display device in which a no-load alternating current (AC) signal synchronized with a touch sensor driving signal is supplied to gate lines.

Description of the Background

Research into a technique of embedding a photo sensor in a pixel array of a display panel has actively been conducted. However, the photo sensor embedded in the display panel is vulnerable to noise because noise can be added to a photo sensor signal through lines and parasitic capacitance of the display panel. Further, an output voltage of an amplifier amplifying the photo sensor signal can be low.

SUMMARY

The present disclosure provides a display panel including a photo sensor in which noise of a touch sensor is removed and an output voltage of an amplifier is increased, and a display device using the same.

In an aspect, a display panel includes pixels into which pixel data of an input image is written; data lines connected to the pixels; photo sensors sensing light; read-out lines connected to the photo sensors; and gate lines connected to the pixels and the photo sensors.

The photo sensors may include at least one first photo sensor to which a first bias voltage is supplied; and at least one second photo sensor to which a second bias voltage different from the first bias voltage is supplied.

BRIEF DESCRIPTION OF THE DRAWINGS

The accompanying drawings, which are included to provide a further understanding of the present disclosure and are incorporated in and constitute a part of the disclosure, illustrate aspects of the present disclosure and together with the description serve to explain the principles of the present disclosure.

In the drawings:

FIGS. 9 and 10A, 10B, and 10C are views illustrating various methods of connecting first and second photo sensors and read-out lines;

DETAILED DESCRIPTION

Figure 1:
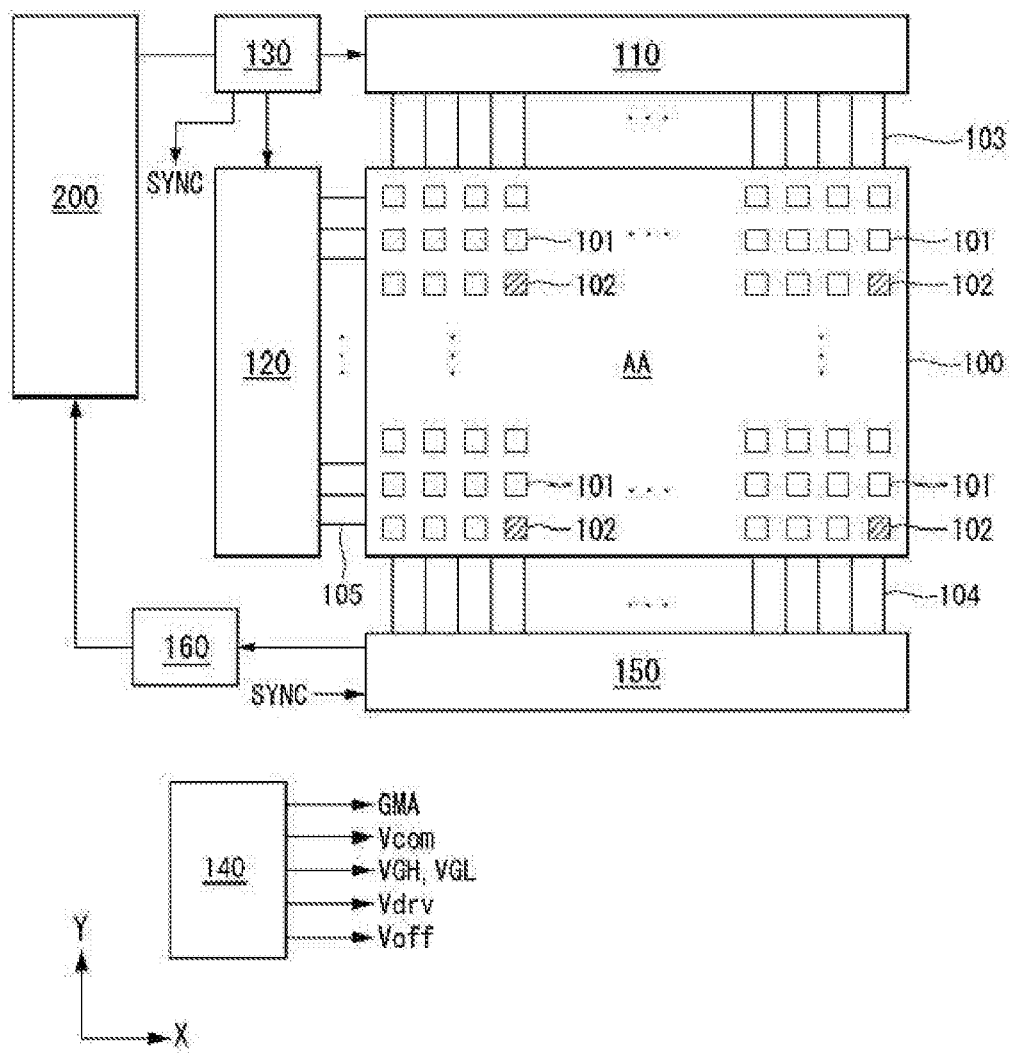
FIGS. 1 and 2 are views schematically illustrating a display device according to an aspect of the present disclosure.

Advantages and features of the present disclosure, and methods for accomplishing the same will be more clearly understood from exemplary aspects described below with reference to the accompanying drawings. However, the present disclosure is not limited to the following exemplary aspects but may be implemented in various different forms. The exemplary aspects are provided only to complete disclosure of the present disclosure and to fully provide a person having ordinary skill in the art to which the present disclosure pertains with the category of the disclosure, and the present disclosure will be defined by the appended claims.

The shapes, sizes, ratios, angles, numbers, and the like illustrated in the accompanying drawings for describing the exemplary aspects of the present disclosure are merely examples, and the present disclosure is not limited thereto. Like reference numerals generally denote like elements throughout the present specification. Further, in the following description, a detailed explanation of known related technologies may be omitted to avoid unnecessarily obscuring the subject matter of the present disclosure.

The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

In describing a position relationship, for example, when two portions are described as "~on", "~above", "~below", or "~on the side", one or more other portions may be positioned between the two portions unless "immediately" or "directly" is used.

It will be understood that, although the terms "first", "second", etc. may be used herein to describe various elements, these elements should not be limited by these terms.

The features of various aspects of the present disclosure can be partially or entirely bonded to or combined with each other and can be interlocked and operated in technically various ways as can be fully understood by a person having ordinary skill in the art, and the aspects can be carried out independently of or in association with each other.

In a display device of the present disclosure, a pixel and a touch sensor may include one or more transistors. A transistor is a three-electrode element including a gate, a source, and a drain. The source is an electrode that supplies carriers to the transistor. Within the transistor, the carriers start to flow from the source. The drain is an electrode from which the carriers exit from the transistor. In the transistor, the carriers flow from the source to the drain. In the case of an n-channel transistor, since the carriers are electrons, a source has a voltage lower than that of a drain so that electrons may flow from the source to the drain. In the n-channel transistor, current flows from the drain toward the source. In the case of a p-channel transistor, since the carriers are holes, a source has a voltage higher than that of a drain so that holes may flow from the source to the drain. In the p-channel transistor, current flows from the source to the drain because the holes flow from the source to the drain. It should be noted that the source and drain of the transistor are not fixed. For example, the source and the drain may be changed depending on an applied voltage. Therefore, the disclosure is not limited by the source and the drain of the transistor. In the following description, one of the source and the drain of the transistor may be referred to as a first electrode and the other of the source and the drain of the transistor may be referred to as a second electrode.

A gate signal may swing between a gate on voltage and a gate off voltage. The gate on voltage is set to a voltage higher than a threshold voltage of the transistor, and the gate off voltage is set to a voltage lower than the threshold voltage of the transistor. The transistor is turned on in response to the gate on voltage, while it is turned off in response to the gate off voltage. In the case of the n-channel transistor, the gate on voltage may be a gate high voltage (VGH) and the gate off voltage may be a gate low voltage (VGL). The gate high voltage VGH is higher than the gate low voltage VGH. In the case of the p-channel transistor, the gate on voltage may be the gate low voltage (VGL) and the gate off voltage may be the gate high voltage (VGH).

The display device of the present disclosure may be implemented as a flat panel display device in which a photo sensor is installed such as a liquid crystal display (LCD), an organic light emitting display, and the like. In the following aspects, a liquid crystal display device will be described as an example of the flat panel display device but the present disclosure is not limited thereto.

Hereinafter, various aspects of the present disclosure will be described in detail with reference to the accompanying drawings.

FIG. 1 is a schematic view illustrating a display device according to an aspect of the present disclosure.

Referring to FIG. 1, the display device of the present disclosure includes a display panel 100, a power supply unit 140, a display panel driver, and a read-out unit 150.

A screen AA of the display panel 100 includes data lines 103, read-out lines 104 parallel to the data lines 103, gate lines 105 perpendicular to the data lines 103, and a pixel array in which pixels 101 and photo sensors 102 defined by the data lines 103 and the gate lines 105 are arranged in a matrix form. The pixels 101 are connected to data lines 103 and gate lines 105. The photo sensors 102 are connected to gate lines 105 and read-out lines 104.

Figure 3:
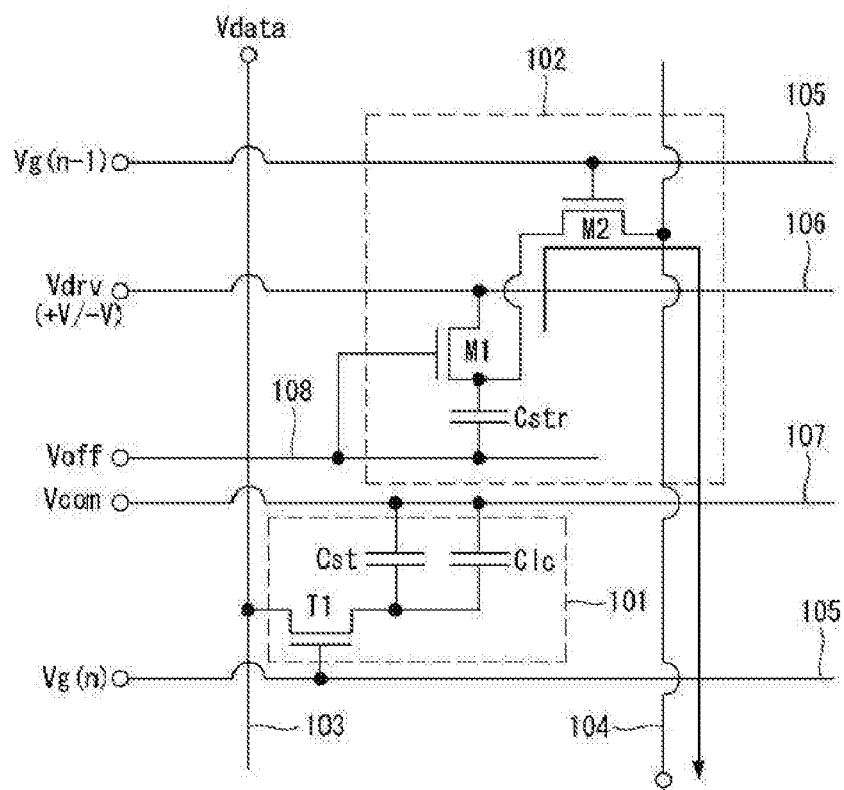
FIG. 3 is a circuit diagram illustrating an example of a pixel circuit and a photo sensor circuit.

Each of the pixels 101 may be divided into a red subpixel, a green subpixel, and a blue subpixel for color representation. Each of the pixels may further include a white subpixel. Each of the subpixels may include a pixel circuit as illustrated in FIG. 3.

The power supply unit 140 may include a charge pump, a regulator, a buck converter, a boost converter, and the like. The power supply unit 140 adjusts a DC input voltage from a host system 200 to generate power necessary for driving the display panel driver, the read-out unit 150, and the display panel 100. The power supply unit 140 may output a gamma reference voltage GMA, a gate high voltage VGH, a gate low voltage VGL, a common voltage Vcom, and photo sensor driving voltages Vdry and Voff. The gamma reference voltage is divided by a voltage divider circuit and converted into a gamma compensation voltage corresponding to a gray voltage of pixel data and supplied to the data driver 110.

The display panel driver writes pixel data of an input image into the pixels 101 to display the input image on the screen AA. The display panel driver includes a data driver 110, a gate driver 120, a timing controller 130, and the like.

The data driver 110 latches the pixel data (digital data) of the input image received from the timing controller 130 and supplies the latched pixel data to a digital-to-analog converter (DAC). The data driver 110 receives the gamma reference voltage GMA from the power supply unit 140 and divides the gamma reference voltage GMA to generate a gamma compensation voltage for each gray level. The DAC of the data driver 110 converts the pixel data into a gamma compensation voltage and outputs a data voltage. The data voltage Vdata varies depending on the gray level of the pixel data and is output to the data lines 103 through an output buffer.

Figure 2:
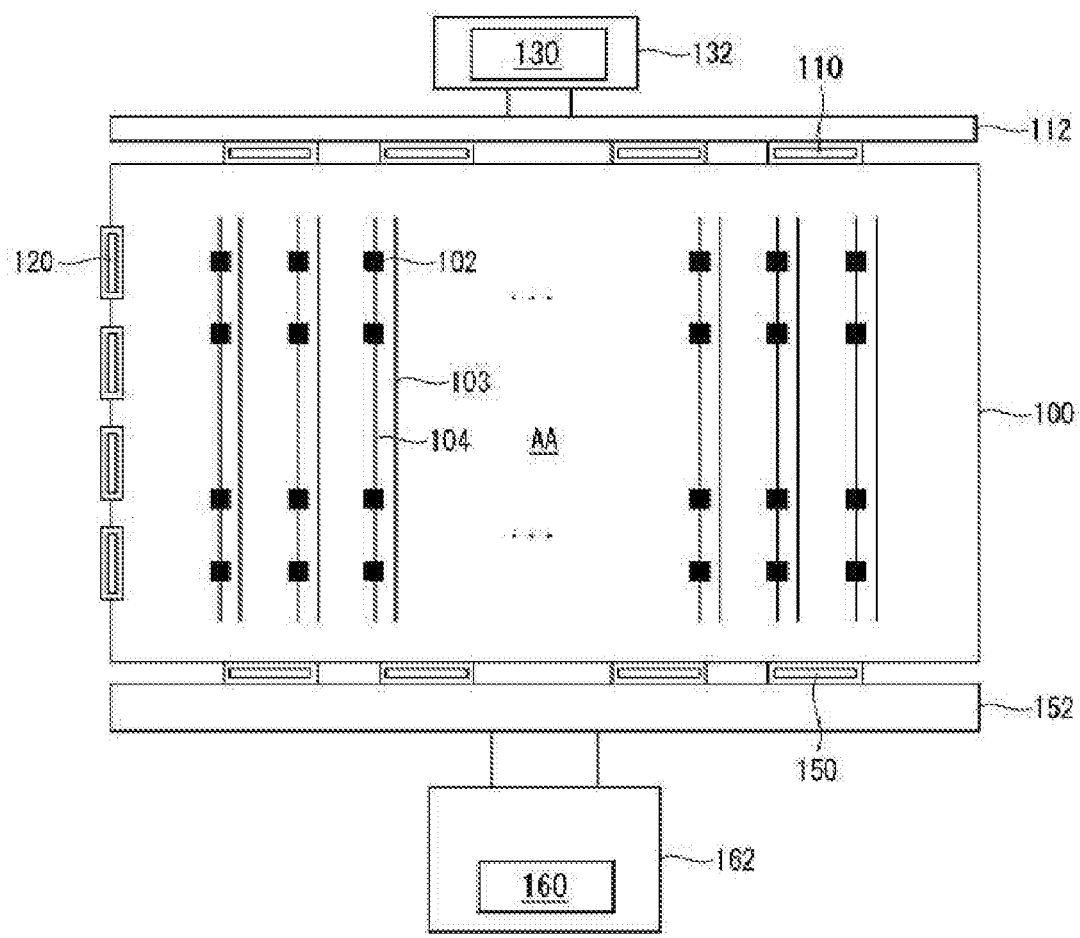

The gate driver 120 includes a shift register that outputs a gate signal synchronized with the data voltage under the control of the timing controller 130. The shift register sequentially supplies the gate signal to the gate lines 105. The gate driver 120 may be formed directly on the display panel 100. The gate signal swings between the gate on voltage VGH and the gate off voltage VGL. The gate driver 120 may be mounted directly on the substrate of the display panel 100 together with the pixel array or may be implemented as a gate driver IC and adhered on the substrate as illustrated in FIG. 2.

The read-out unit 150 is connected to the read-out lines 104, receives and amplifies the signals from the photo sensors 102, converts the amplified signals into digital data, and outputs sensor data SDATA. To this end, the read-out unit 150 may include an amplifier amplifying the photo sensor signals, and an analog-to-digital converter (ADC) converting an output from the amplifier into digital data. The read-out unit 150 may be implemented as a readout integrated circuit (ROIC).

The display device of the present disclosure further includes a logic operation unit 160 that analyzes the sensor data SDATA output from the read-out unit 150 according to a predetermined algorithm to determine the amount of light irradiated to the photo sensor 102.

The logic operation unit 160 may be implemented as a micro-controller unit (MCU) or a field programmable gate array (FPGA). The logic operation unit 160 may control an operation timing of the read-out unit 150 according to a synchronization signal SYNC from the timing controller 130. The logic operation unit 160 may transmit an operation result of the algorithm to the host system 200 or the timing controller 130. The algorithm executed from the logic operation unit 160 may include at least one of a touch recognition algorithm, a fingerprint recognition algorithm, an image scanning algorithm, and the like. The result of determining the amount of light from the photo sensor output from the logic operation unit 160 may include coordinate information, light amount (gradation), and the like.

The timing controller 130 transmits the pixel data (digital data) of the input image received from the host system 200 to the data driver 110. The timing controller 130 generates a signal for controlling operation timings of the data driver 110 and the gate drier 120 using a timing signal received from the host system 200 in synchronization with the pixel data to control the display panel driver. The timing controller 130 may supply a synchronization signal SYNC to the read-out unit 150 to synchronize the gate driver 120 and the read-out unit 150. A gate timing control signal output from the timing controller 130 may be transmitted to the gate driver 120 through a level shifter (not shown). The level shifter converts a voltage of the gate timing control signal into the gate on voltage VGH and the gate off voltage VGH.

The timing signal received from the host system 200 includes a vertical synchronization signal Vsync, a horizontal synchronization signal Hsync, a clock CLK, a data enable signal DE, and the like. The vertical synchronization signal Vsync and the horizontal synchronization signal Hsync may be omitted because one frame period (or vertical period) and one horizontal period 1H may be known by a method of counting the data enable signal DE. The vertical synchronization signal Vsync has a period of one frame period. The horizontal synchronization signal Hsync and the data enable signal DE have a period of one horizontal period 1H.

The host system 200 may be any one of a television, set-top box, a navigation system, a personal computer (PC), a home theater system, a mobile device, and a wearable device. In the mobile device or the wearable device, the data driver 110, the timing controller 130, the power supply unit 140 and the read-out unit 150 may be integrated in a single drive IC (integrated circuit).

The host system 200 converts the pixel data of the input image into a format suitable for display on the display panel 100 and transmits the timing signal together with the pixel data to the timing controller 130. The host system 200 may execute an application associated with a signal received from the read-out unit 150. The application may provide touch input sensing, fingerprint input sensing, laser pointer or laser pen sensing on the screen AA using the photo sensor. In addition, the application may scan a document on the screen AA and print or generate an image file.

When a gate signal is applied to the gate line 105, a data voltage of the pixel data is supplied to the pixels 101 of one pixel line which share this gate line. The photo sensors disposed in one pixel line which share the gate line supply a charge stored in a capacitor to the read-out lines 104 at the same time when the gate on voltage of the gate signal is supplied to the gate line.

In another aspect, the pixels 101 and the photo sensors 102 may be driven in a time division manner. For example, one frame period may be divided into a pixel driving time interval and a photo sensor driving time interval. In this case, the gate driver 120 may output the gate signal during the pixel driving time interval and the gate signal during the photo sensor driving time interval.

The display device of the present disclosure may be implemented as illustrated in FIG. 2.

Referring to FIG. 2, the data driver 110 may include a plurality of source drive ICs. The source drive ICs may be mounted on a chip on film (COF) connected to a first printed circuit board (PCB) 112. The COFs on which the source drive ICs are mounted may be bonded to an upper end of the display panel 100 with an anisotropic conductive film (ACF) and connected to the data lines 103. The timing controller 130 is mounted on a first control board 132. The first control board 132 is connected to the COFs on which the source drive ICs are mounted through a flexible circuit cable such as a flexible flat cable (FFC). The power supply unit 140 and the level shifter are mounted on the first control board 132.

The read-out unit 150 may include a plurality of ROICs. The ROICs may be mounted on the COF connected to a second PCB 152. The COFs in which the ROICs are mounted may be bonded to the lower end of the display panel 100 with the ACF and connected to the read-out lines 104. The MCU or FPGA in which the logic operation unit 160 is integrated is mounted on the second control board 162. The second control board 162 is connected to the COFs on which the ROICs are mounted via a flexible circuit cable.

Figure 4:
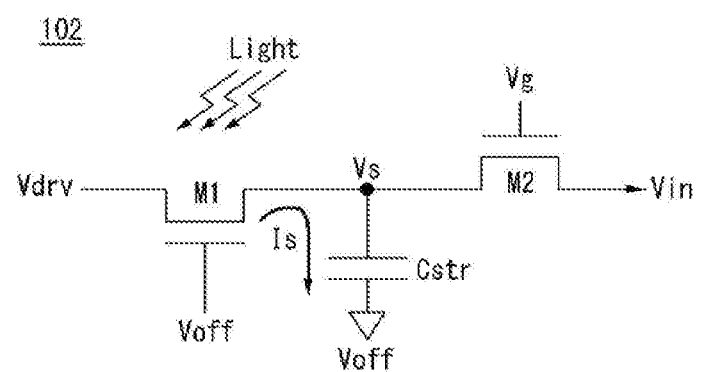
FIG. 4 is a circuit diagram illustrating a photo sensor.

FIG. 3 is a circuit diagram illustrating an example of a pixel circuit and a photo sensor circuit. The pixel circuit illustrated in FIG. 3 illustrates a pixel of a liquid crystal display device. FIG. 4 is a circuit diagram illustrating a photo sensor.

Referring to FIGS. 3 and 4, the pixel circuit includes a pixel thin film transistor (TFT) T1, a liquid crystal cell Clc, and a first storage capacitor Cst1.

The pixel TFT T1 is turned on according to the gate on voltage VGH of the gate signal Vg(n) to supply the data voltage Vdata from the data line 104 to the pixel electrode of the liquid crystal cell Clc. The pixel TFT T1 includes a gate connected to the gate line 105, a first electrode connected to the data line 103, and a second electrode connected to the pixel electrode and the storage capacitor Cst.

A first electrode of the storage capacitor Cst is connected to a Vcom line to which a common voltage Vcom is applied and a common electrode of the liquid crystal cell Clc. The common voltage Vcom may be a voltage of 7V to 8V, but is not limited thereto. A positive polarity data voltage is higher than the common voltage Vcom and a negative polarity data voltage is lower than the common voltage Vcom. A second electrode of the storage capacitor Cst is connected to the second electrode of the pixel TFT and the pixel electrode. The storage capacitor Cst stores a difference voltage between the pixel electrode voltage and the common voltage Vcom to keep the voltage of the liquid crystal cell Clc constant.

The photo sensor 102 includes a sensor TFT M1, a sensor capacitor Cstr, and a switching TFT M2.

The sensor TFT M1 maintains an off state according to the gate off voltage Voff. When a semiconductor layer of the sensor TFT M1 is exposed to light, a photo current is generated in the semiconductor layer and a charge is charged in the sensor capacitor Cstr. A color filter or an infrared pass filter, rather than a metal or a black matrix, may be formed on an upper substrate of the display panel 100 facing the sensor TFT M1 so that light incident on the sensor TFT T2 is not interfered.

Figure 5:
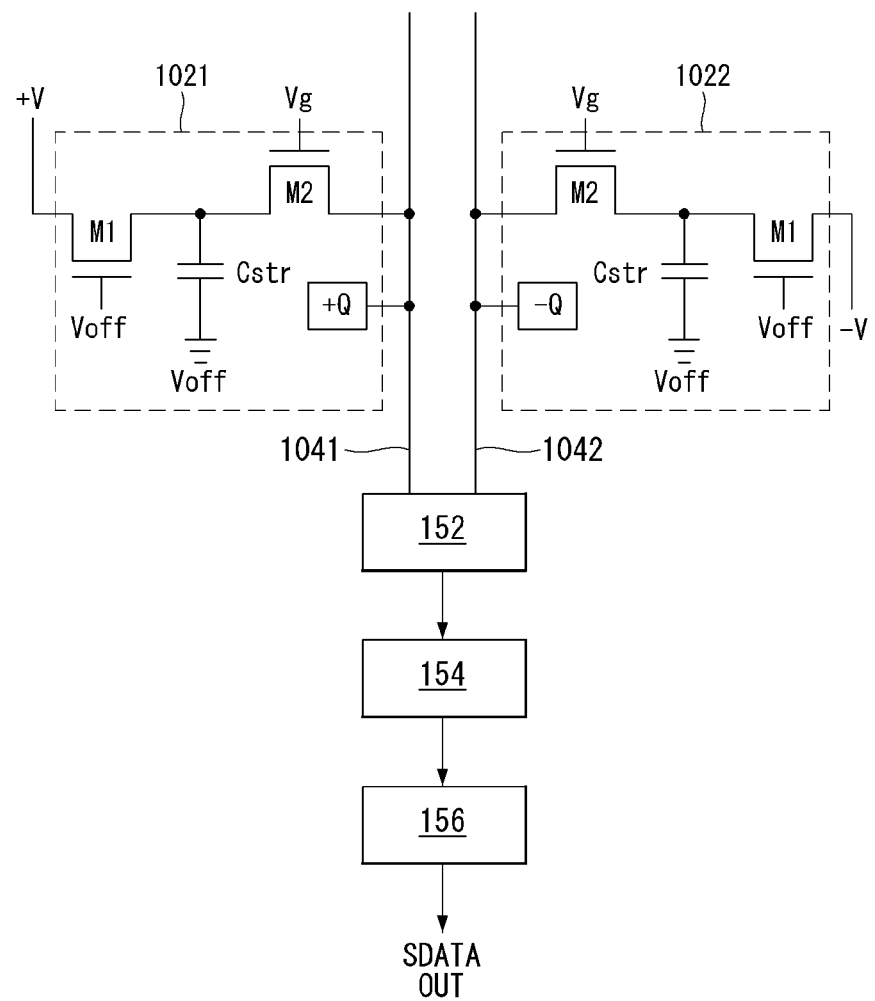
FIG. 5 is a circuit diagram illustrating a photo sensor and a read-out unit according to an aspect of the present disclosure.

A gate of the sensor TFT M1 is connected to a Voff line 108 to which the gate off voltage Voff is applied. The gate off voltage Voff may be set to −20V, but is not limited thereto. A first electrode of the sensor TFT M1 is connected to a Vdry line 106 and a bias voltage Vdry is supplied thereto. The bias voltage Vdry is a positive polarity bias voltage +V or a negative polarity bias voltage −V. The positive polarity bias voltage +V and the negative polarity bias voltage −V may be 19V and −14V, respectively, but are not limited thereto. As illustrated in FIG. 5, the positive polarity bias voltage +V is applied to a first photo sensor 1021. The negative polarity bias voltage −V is applied to a second photo sensor 1022. A second electrode of the sensor TFT M1 is connected to the sensor capacitor Cstr and the switching TFT M2.

The sensor capacitor Cstr stores charges generated by the photo current when the switching TFT M1 is off. A first electrode of the sensor capacitor Cstr is connected to the second electrode of the sensor TFT M1 and the first electrode of the switching TFT M2. A second electrode of the sensor capacitor Cstr is connected to a Voff line 108 to which the gate off voltage Voff is applied. When the second electrode of the sensor capacitor Cstr and the gate voltage of the sensor TFT M1 are controlled to be equal to Voff, the sensor TFT M1 and the sensor capacitor Cstr are connected to one line, i.e., the Voff line 108, and thus, the number of lines added due to the photo sensor in the pixel array may be reduced. The charge of the capacitor Cstr is supplied to the read-out line 104 when the switching TFT M2 is turned on.

The switching TFT M2 is turned on according to the gate on voltage VGH of a gate signal Vg(n−1) to form a current path between the sensor capacitor Cstr and the read-out line 104 to allow the charge of the sensor capacitor Cstr to flow to the read-out line 104. A gate of the switching TFT M2 is connected to the gate line 105. A first electrode of the switching TFT M2 is connected to the second electrode of the sensor TFT M1 and the first electrode of the sensor capacitor Cstr. The second electrode of the switching TFT M2 is connected to the read-out line 104. A voltage Vin applied to the read-out line 104 varies depending on the amount of charge from the photo sensor 102. The voltage Vin of the read-out line 104 is input to an amplifier of the read-out unit 150.

When a photo current generated when a semiconductor layer of the sensor TFT M1 is exposed to light when the positive polarity bias voltage +V is applied to the sensor TFT M1 is Ion and a leakage current when the semiconductor layer is not exposed to light is Ioff, Ion=1.0×e−12 [A], Ioff=1.0×e−9 [A], which makes a difference of about 103 times. Here, a current generated from a photo sensor (hereinafter referred to as "exposed sensor") exposed to light flows to the read-out line 104 and a current from a photo sensor (hereinafter referred to as "unexposed sensor") not exposed to light flows to the read-out line 104, so that a difference between a voltage of the exposed sensor and a voltage of the unexposed sensor is reduced and an output voltage of the amplifier is lowered.

In FIG. 4, a driving voltage of the photo sensor in FIG. 4 is set to +V>Vref >−V>Voff. Here, Vref is a reference voltage corresponding to ½ voltage between +V and −V. The reference voltage Vref may be set to a reference voltage of a differential amplifier 152.

In the present disclosure, as illustrated in FIG. 5, a signal from the first photo sensor 1021 in which a positive charge signal +Q is generated and a signal from the second photo sensor 1022 in which a negative charge signal −Q may be input to one differential amplifier to remove noise which is a common mode signal and a difference voltage between the positive charge signal and the negative charge signal may be amplified to thereby increase an output voltage of the amplifier.

Figure 6:
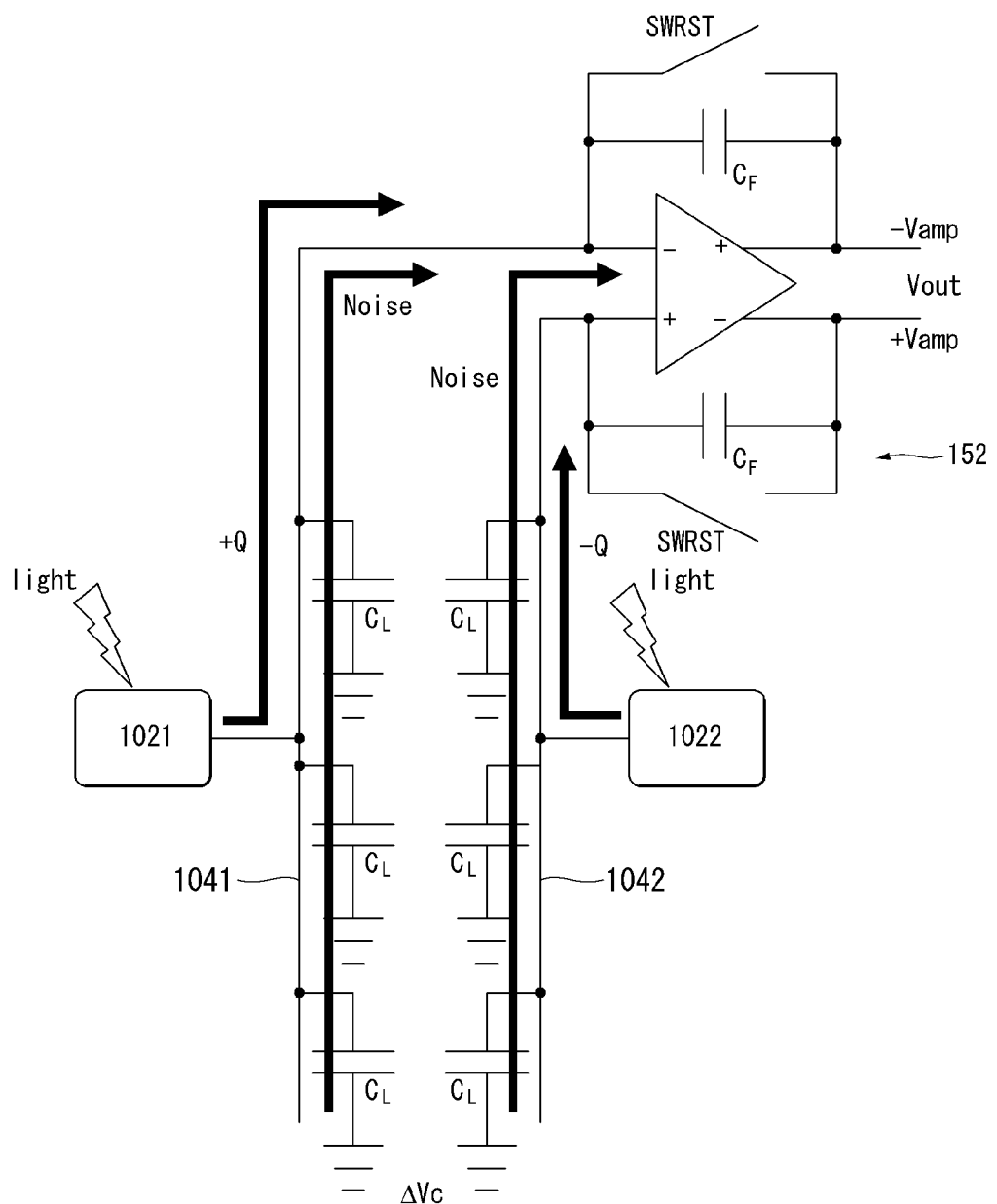
FIG. 6 is a circuit diagram illustrating input/output voltages of a fully differential amplifier.
Figure 7:
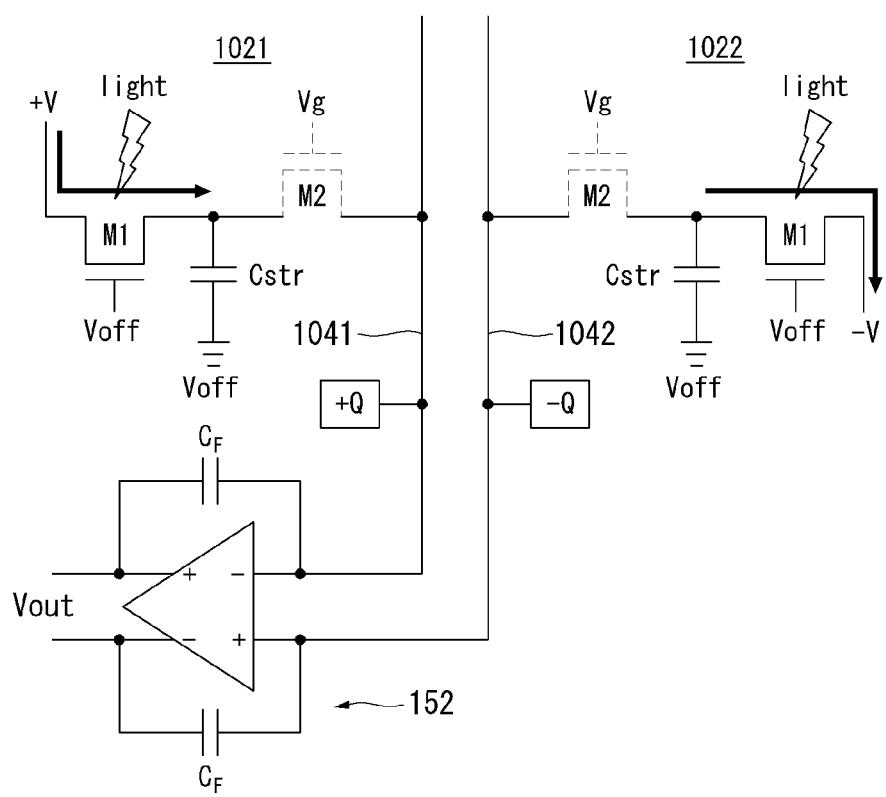
FIGS. 7 and 8 are circuit diagrams illustrating operations of first and second photo sensors by stages.
Figure 8:
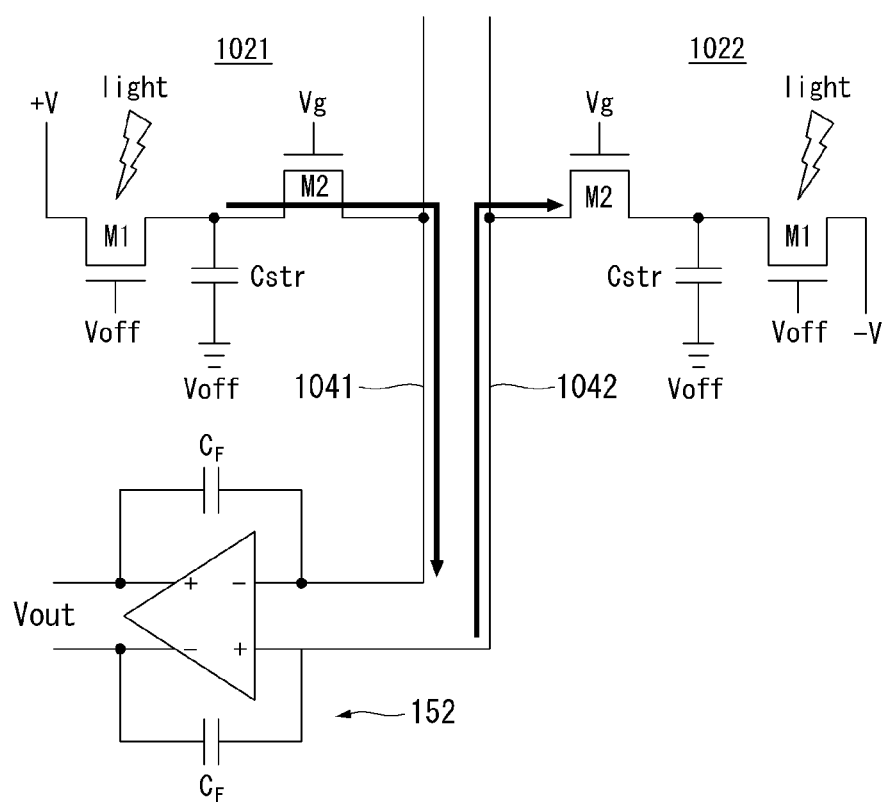

FIG. 5 is a circuit diagram illustrating the photo sensor 102 and the read-out unit 150 according to an aspect of the present disclosure. FIG. 6 is a circuit diagram illustrating an input/output voltage of a fully differential amplifier.

Referring to FIGS. 5 and 6, the read-out unit 150 includes a differential amplifier 152, a sample and holder 154, and an ADC 156. The amplifier 152 may be implemented as a fully differential amplifier as illustrated in FIG. 6. The fully differential amplifier removes the common mode signal (noise) of a signal input to an inverting input terminal and a non-inverting input terminal and amplifies a differential signal.

The sample and holder 154 samples an output voltage Vout from the differential amplifier 152 and supplies the sampled output voltage Vout to the ADC 156. The ADC 156 converts the voltage input through the sample and holder 154 into digital data and outputs sensor data SDATA.

The first photo sensor 1021, to which the positive polarity bias voltage +V is applied, generates a positive charge signal +Q. The first photo sensor 1021 may be connected to the inverting input terminal (−) of the differential amplifier 152 through a first read-out line 1041. The second photo sensor 1022, to which the negative polarity bias voltage −V is applied, generates a negative charge signal −Q. The second photo sensor 1022 may be connected to the non-inverting input terminal (+) of the differential amplifier 152 via a second read-out line 1042.

The differential amplifier 152 includes an operational amplifier having an inverting input terminal (−), a non-inverting output terminal (+), a non-inverting input terminal (+), and an inverting output terminal (−). The differential amplifier 152 further includes a capacitor CF connected between the inverting input terminal (−) and the non-inverting output terminal (+), a reset switch element SWRST connected between the inverting input terminal (−) and the non-inverting output terminal (+), a capacitor CF connected between the non-inverting input terminal (+) and the inverting output terminal (−), and a reset switch element SWRST connected between the non-inverting input terminal (+) and the inverting output terminal (−).

In FIG. 6, Vc is a common mode signal including noise. The differential amplifier 152 removes noise from the first read-out line 1041 and the second read-out line 1042 and amplifies the differential signal to generate an output voltage Vout. This may be expressed by an equation as follows. The output voltage Vout is twice as large as that of the differential amplifier in which the photo sensor is connected only to the inverting input terminal because the positive and negative charge signals are each amplified.

$$+Vamp = \frac{-Q}{C_F} + \Delta Vc \frac{C_L}{C_F}$$

$$-Vamp = \frac{+Q}{C_F} + \Delta Vc \frac{C_L}{C_F}$$

$$Vout = (+Vamp) - (-Vamp) = -\frac{2Q}{C_F}$$

Here, +Vamp is a voltage of the non-inverting output terminal (+) of the differential amplifier 152, and −Vamp is a voltage of the inverting output terminal (−) of the differential amplifier 152. CL is parasitic capacitance connected to the read-out lines 1041 and 1042. ΔVc is the common mode signal including noise. Vout is a difference signal output voltage between +Vamp and −Vamp.

The differential amplifier 152 amplifies each of the positive charge signal and the negative charge signal and removes noise. Therefore, a difference between the sensor signal and noise may be increased to improve a signal-to-noise ratio (SNR). In addition, since the output voltage of the differential amplifier 152 is large so as to increase an input voltage of the ADC 156, resolution of the ADC 156 may be improved.

FIGS. 9 and 10A, 10B, and 10C are views illustrating various methods of connecting the first and second photo sensors and the read-out lines.

As illustrated in FIG. 9, the first photo sensors 1021 are arranged in a row along a first column C1 in a Y-axis direction on the screen AA and connected to a first read-out line 1041. The second photo sensors 1022 may be arranged in a row along a second column C2 in the Y axis direction on the screen AA and connected to a second read-out line 1042.

Figure 10A:
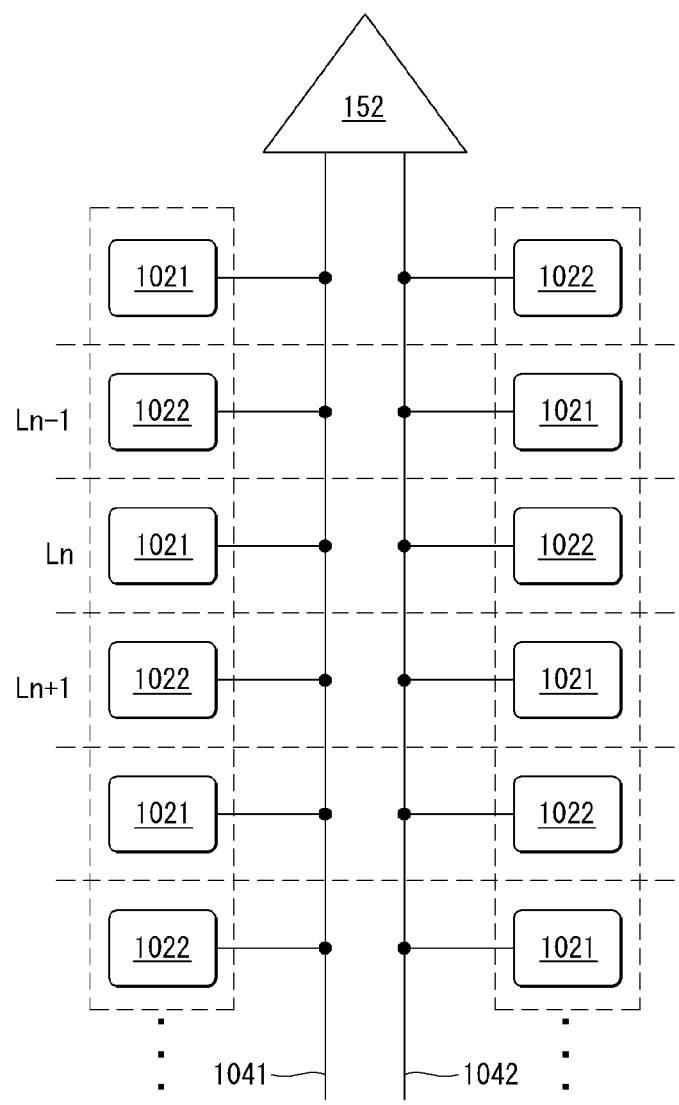
Figure 10B:
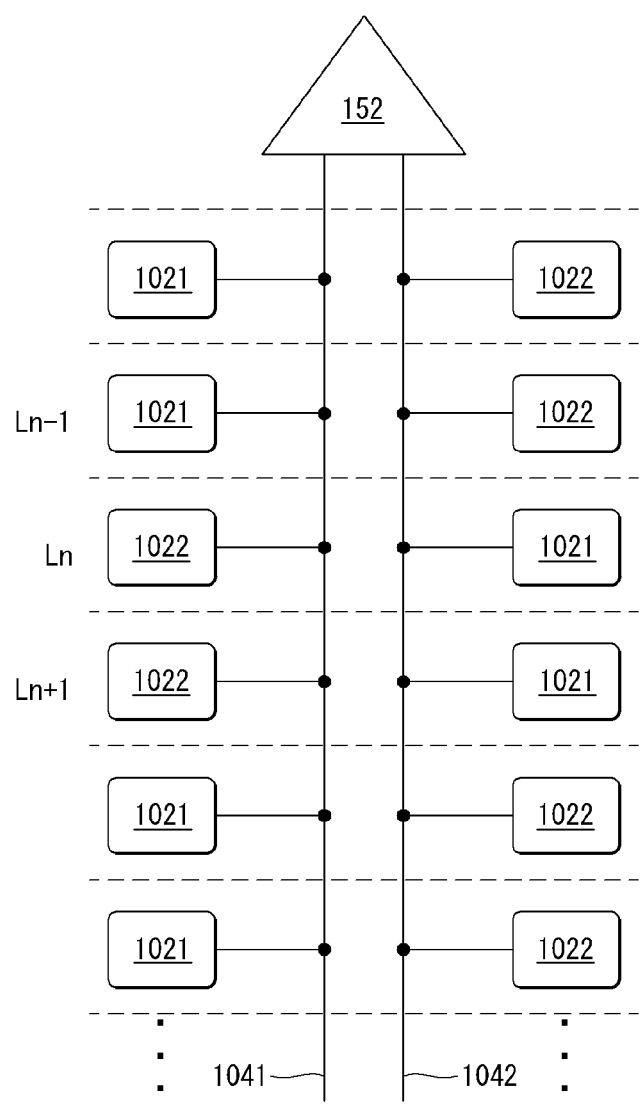
Figure 10C:
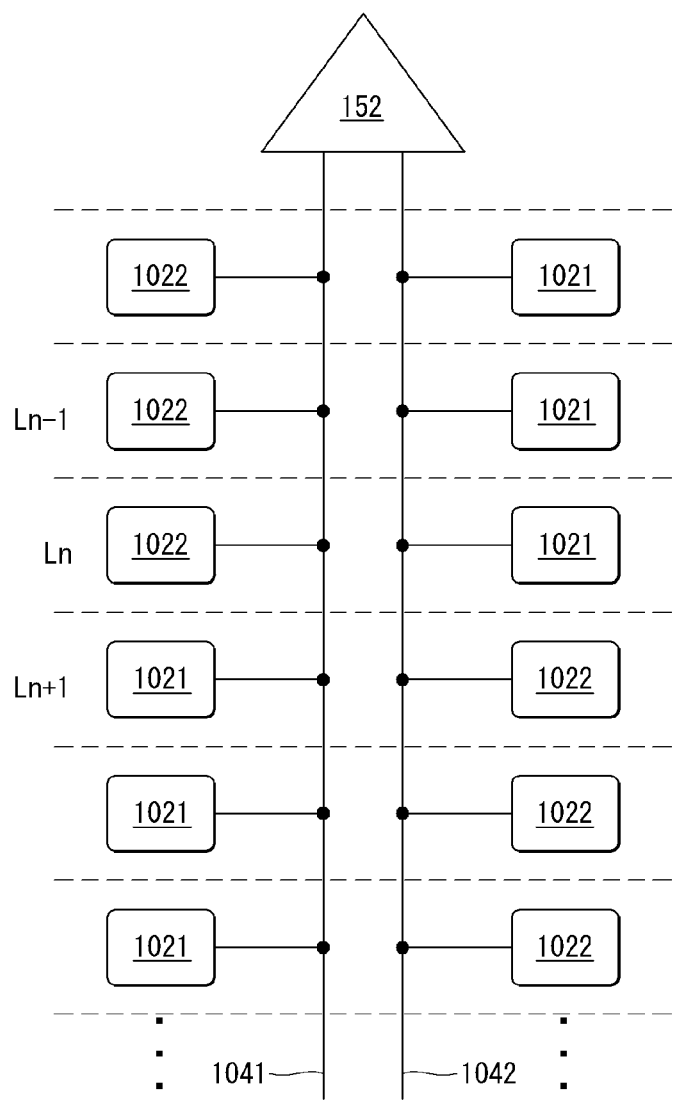

Referring to FIGS. 10A, 10B, and 10C, the first and second photo sensors 1021 and 1022 are alternately arranged at N dot intervals on the screen AA and connected to read-out lines 1041 and 1042. N is a natural number smaller than ½ of vertical resolution of the photo sensors arranged on the screen. N dots refers to N photo sensors.

FIG. 10A shows an example in which the first and second photo sensors 1021 and 1022 are arranged at 1-dot intervals. The first and second photo sensors 1021 and 1022 may be arranged adjacent to each other in pixel lines Ln−1, Ln, and Ln+1 in an X-axis direction and alternately arranged at 1-dot intervals along the column of a Y-axis direction.

In a first column C1, the first photo sensors 1021 may be arranged at the odd-numbered photo sensor positions, and the second photo sensors 1022 may be arranged at the even-numbered photo sensor positions. The first and second photo sensors 1021 and 1022 arranged in the first column C1 are connected to the first read-out line 1041. In the second column C2, the second photo sensors 1022 may be arranged at the odd-numbered photo sensor positions, and the first photo sensors 1021 may be arranged at the even-numbered photo sensor positions. The first and second photo sensors 1021 and 1022 arranged in the second column C2 are connected to the second read-out line 1042.

Since the gate signal is sequentially applied to the gate lines 105, a photo sensor signal is output by each pixel line. For example, after signals of the photo sensors 1021 and 1022 of the (n−1)th (n is a positive integer) pixel line Ln−1 are output to the read-out lines 1041 and 1042, signals of the photo sensors 1021 and 1022 of the nth pixel line Ln are output to the read-out lines 1041 and 1042, respectively. Subsequently, the signals of the photo sensors 1021 and 1022 of the (n+1)th pixel line Ln+1 are output to the read-out lines 1041 and 1042.

FIG. 10B shows an example in which the first and second photo sensors 1021 and 1022 are arranged at 2-dot intervals. The first and second photo sensors 1021 and 1022 may be arranged adjacent to each other in the pixel lines Ln−1, Ln, and Ln+1 in the X-axis direction and alternately arranged at 2-dot intervals along the column of the Y-axis direction.

In the first column C1, the first photo sensors 1021 may be arranged at (4k+1)th (k is a positive integer) and (4k+2)th photo sensor positions and the second photo sensors 1022 may be arranged at (4k+3)th and (4k+4)th photo sensor positions. The first and second photo sensors 1021 and 1022 arranged in the first column C1 are connected to the first read-out line 1041. In the second column C2, the second photo sensors 1022 may be arranged at (4k+1)th and (4k+2)th photo sensor positions and the first photo sensors 1021 may be arranged at (4k+3)th and (4k+4)th photo sensor positions. The first and second photo sensors 1021 and 1022 arranged in the second column C2 are connected to the second read-out line 1042.

FIG. 10C shows an example in which the first and second photo sensors 1021 and 1022 are arranged at 3-dot intervals. The first and second photo sensors 1021 and 1022 may be arranged adjacent to each other in the pixel lines Ln−1, Ln, and Ln+1 in the X-axis direction and alternately arranged at 3-dot intervals along the column of the Y-axis direction.

In the first column C1, the first photo sensors 1021 may be arranged at (6k+1)th to (6k+3)th photo sensor positions and the second photo sensors 1022 may be arranged at (6k+4)th and (6k+6)th photo sensor positions. The first and second photo sensors 1021 and 1022 arranged in the first column C1 are connected to the first read-out line 1041. In the second column C2, the second photo sensors 1022 may be arranged at (6k+1)th to (6k+3)th photo sensor positions and the first photo sensors 1021 may be arranged at (6k+4)th and (6k+6)th photo sensor positions. The first and second photo sensors 1021 and 1022 arranged in the second column C2 are connected to the second read-out line 1042.

As illustrated in FIG. 9, when the photo sensors 1021 and 1022 are connected to the read-out lines 1041 and 1042 respectively, since the photo sensors having the same polarity are connected to one read-out line, an unexposed sensor signal is reflected in an exposed sensor signal, and thus, the unexposed sensor signal may be reflected in an output voltage from the differential amplifier 152. In contrast, when the first and second photo sensors are alternately arranged at the N-dot intervals as illustrated in FIGS. 10A, 10B, and 10C, the opposite unexposed sensor signals may be canceled out with each other due to the photo sensors having the different polarities connected to one read-out line. Therefore, in the case of FIGS. 10A, 10B, and 10C, the ratio of the unexposed sensor signal to the output voltage of the differential amplifier may be significantly lowered, as compared with that in FIG. 9.

Figure 11:
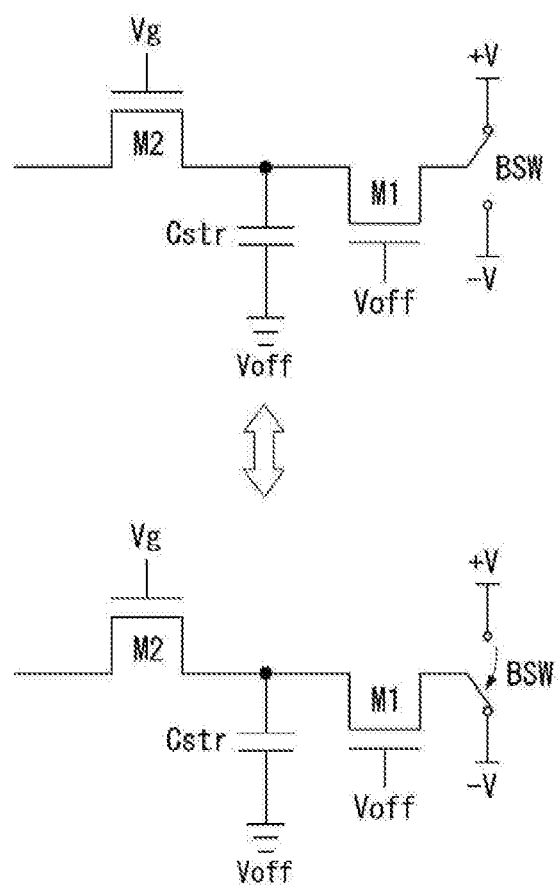
FIG. 11 is a circuit diagram illustrating bias voltage switching of a photo sensor.

FIG. 11 is a circuit diagram illustrating bias voltage switching of the photo sensor 102.

Referring to FIG. 11, the photo sensor 102 may operate as a first photo sensor 1021 or a second photo sensor 1022 according to polarities of a bias voltage through a power switch element BSW.

The power switch element BSW may be connected to an output terminal Vdry of the power supply unit 140 to switch a bias voltage Vdry applied to a Vdry line 106 between +V and −V. In this case, the Vdry line 106 may be alternately supplied with the positive polarity bias voltage +V and the negative polarity bias voltage −V at a predetermined time period. The power switch element BSW may switch the positive polarity bias voltage +V and the negative polarity bias voltage −V at a predetermined time period under the control of the timing controller 130. The predetermined time period may be one frame period, but is not limited thereto. For example, the power switch element BSW supplies the positive polarity bias voltage +V to the photo sensor 102 during a first frame period, and then supplies the negative polarity bias voltage −V to the photo sensor 102 during a second frame period.

The photo sensor 102 illustrated in FIG. 11 may be applied to FIGS. 9 to 10C. When the photo sensor 102 is switched between the first and second photo sensors 1021 and 1022 at a predetermined time period, the capacitor Cstr of the photo sensor 102 repeats charging and discharging, preventing residual charges having the same polarity from being accumulated in the capacitor Cstr, and thus, reliability and durability of capacitance of the photo sensor may be enhanced.

When the bias voltage having the same polarity is continuously applied to the sensor TFT M1, the sensor TFT M1 may be deteriorated due to accumulation of bias stress and a threshold voltage may be shifted. As illustrated in FIG. 11, if the polarity of the bias voltage applied to the sensor TFT M1 is inverted at a predetermined time period, the bias stress of the sensor TFT M1 may be reduced to improve reliability and lifetime of the device.

The power switch BSW may switch a voltage during a vertical blanking VB interval in which there is no input image every frame period.

Figure 12:
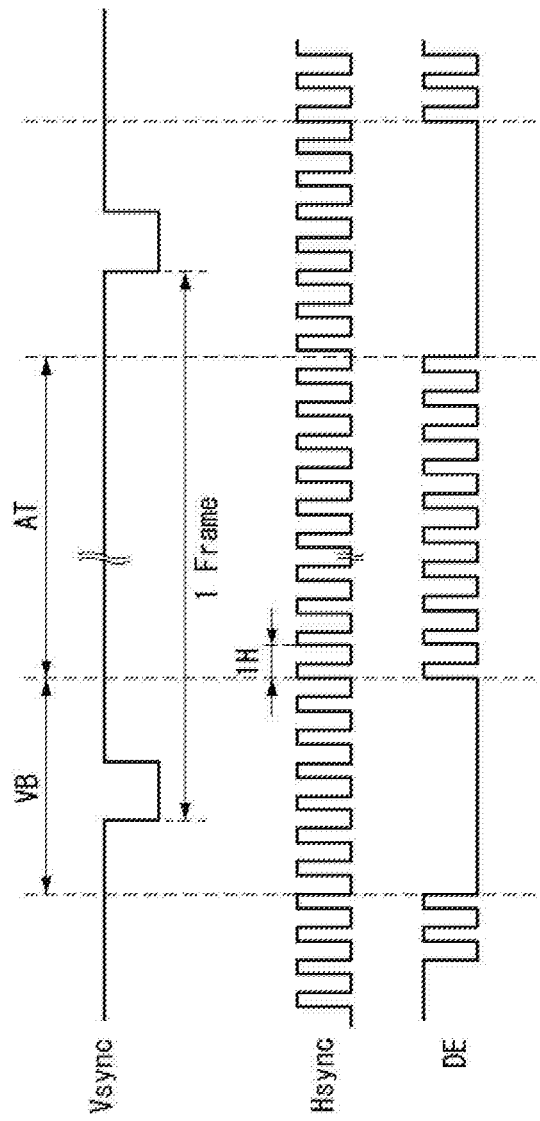
FIG. 12 is a waveform view illustrating a vertical blank interval.

FIG. 12 is a waveform view illustrating a vertical blank interval.

Referring to FIG. 12, one frame period is divided into an active interval AT in which pixel data of an input image is present and a vertical blank interval VB in which no pixel data is present. During the active interval AT of the frame period, pixel data is written into all the pixels on the screen of the display panel 100.

The vertical blank interval VB is a blank period during which pixel data of the input image is not received by the timing controller 130 and pixel data is not written to the pixels of the display panel 100.

The vertical synchronization signal Vsync defines one frame period. One period of the horizontal synchronization signal Hsync and the data enable signal DE is one horizontal period 1H. The data enable signal DE defines a valid data period in synchronization with pixel data to be displayed on the pixels of the screen AA. Pixel data of one pixel line is written into pixels of one pixel line during one horizontal period 1H. One horizontal period 1H is a time obtained by dividing one frame period by horizontal resolution of the screen AA, i.e., the number of pixel lines.

Figure 13:
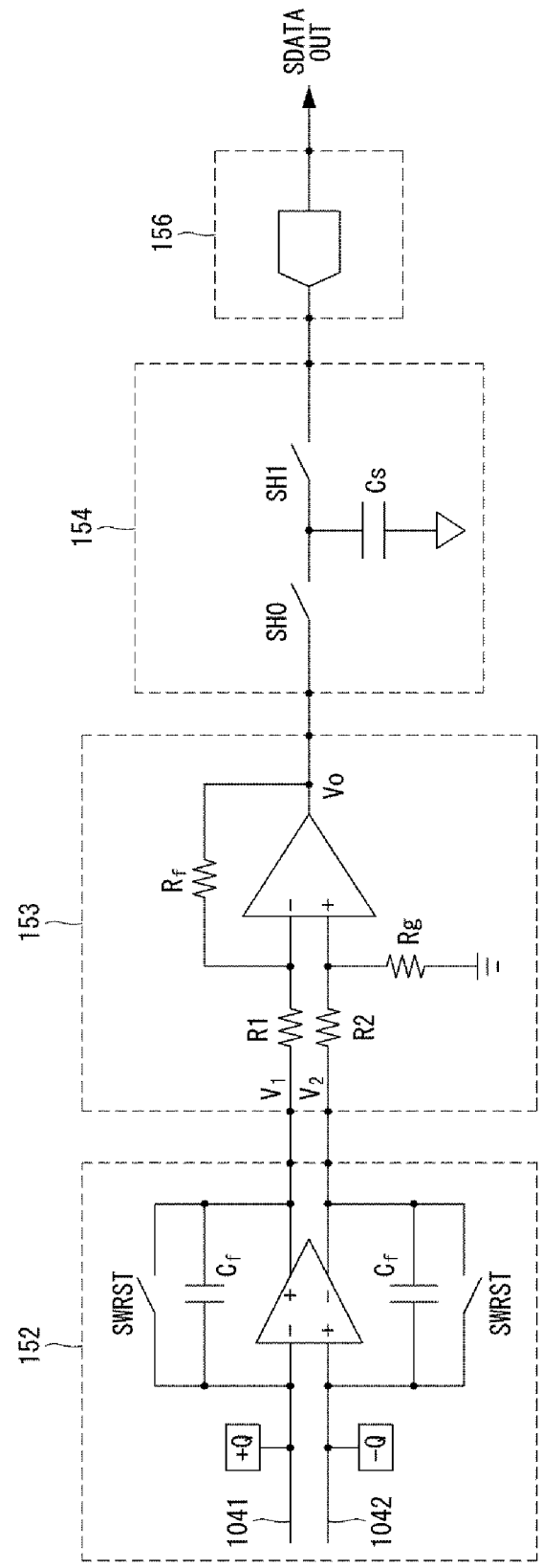
FIG. 13 is a view illustrating another aspect of a read-out unit.

FIG. 13 is a view illustrating another aspect of the read-out unit 150.

Figure 14:
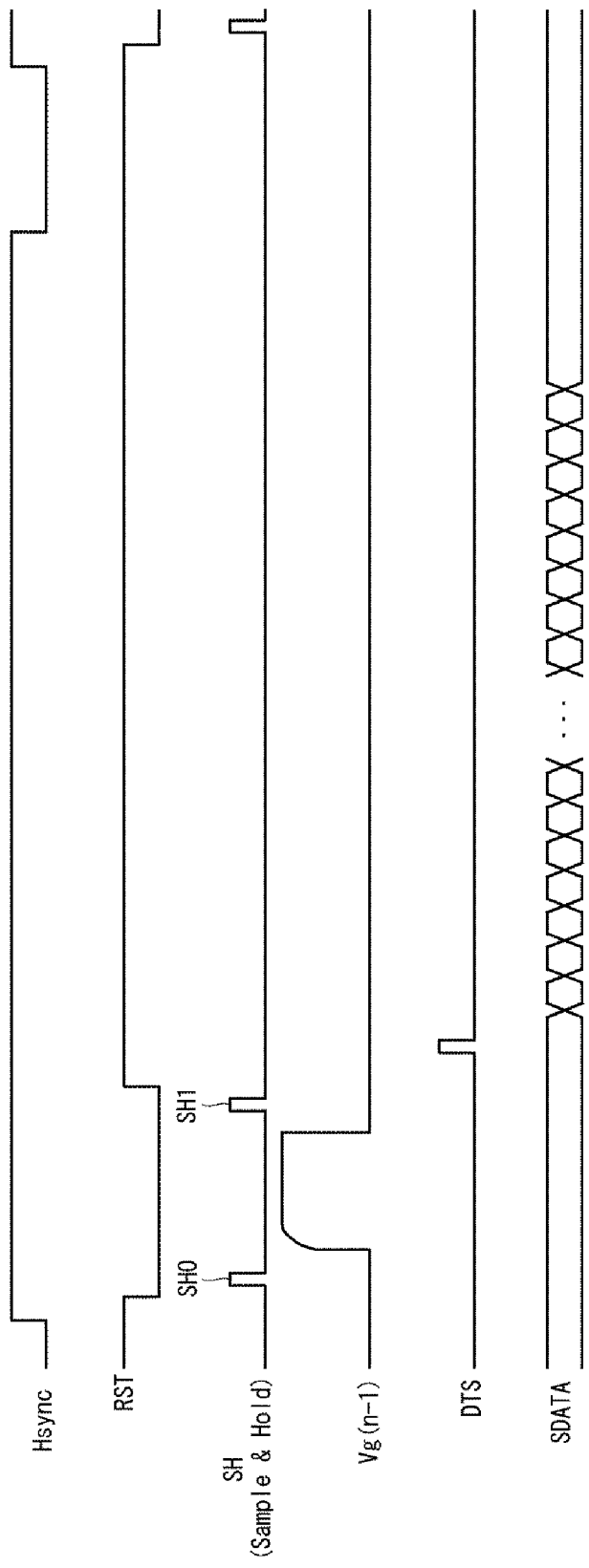
FIG. 14 is a waveform view illustrating input/output signals of a read-out unit.

Referring to FIG. 13, the read-out unit 150 includes a second differential amplifier 153 connected between the first differential amplifier 152 and the sample and holder 154. The first differential amplifier 152 may be implemented as a fully differential amplifier as described above. FIG. 14 is a waveform view illustrating an input/output signal of the read-out unit.

The second differential amplifier 153 includes an operational amplifier having an inverting input terminal (−), a non-inverting input terminal (+), and a single output terminal. The second differential amplifier 153 further includes a resistor R1 connected to the inverting input terminal (−), a resistor Rf connected between the inverting input terminal (−) and the single output terminal, a resistor R2 connected to the non-inverting input terminal (+), and a resistor Rg connected between the non-inverting input terminal (+) and a ground voltage source GND. A resistance value is set to R1=R2 and Rf=Rg. The second differential amplifier 153 amplifies output voltages V1 and V2 of the first differential amplifier 152 by a resistance ratio Rf/R1 and supplies the amplified output voltages V1 and V2 to the sample and holder 154. An output voltage Vo of the second differential amplifier 153 is Vo=R_f/R_1 (V_2−V_1).

The sample and holder 154 includes a first switch element SH0 and a second switch element SH1. The second switch element SH1 is turned on after the first switch element SH0 is turned on as illustrated in FIG. 6.

When the first switch element SH0 is turned on, the second switch element SH1 remains off. When the first switch element SH0 is turned on, an output voltage of the differential amplifier is charged to a capacitor Cs and sampled. The output voltage of the differential amplifier is Vout in FIG. 6 or Vo in FIG. 13. Subsequently, the first switch element SH0 is turned off and the second switch element SH1 is turned on. The voltage of the capacitor Cs is input to the ADC 154 when the second switch element SH0 is turned on.

In FIG. 14, "RST" is a reset signal for controlling ON/OFF of the reset switch element SWRST. The reset switch element SWRST is turned on according to high logic H of the reset signal RST to short-circuit both ends of the capacitor CF to initialize the voltage of the capacitor CF to the reference voltage. Sensor data SDATA output from the ADC 154 is stored in a buffer memory (not shown) and then output through a data transmission unit. The data transmission unit transmits the sensor data SDATA to the host system 200 or the timing controller 130 in response to a data transmission request signal DTS from the logic operation unit 160. The sensor data SDATA may be transmitted through a communication protocol such as universal serial bus (USB), universal asynchronous receiver and transceiver (UART), personal computer memory card international association (PMCIA), RS232, or the like.

Figure 15:
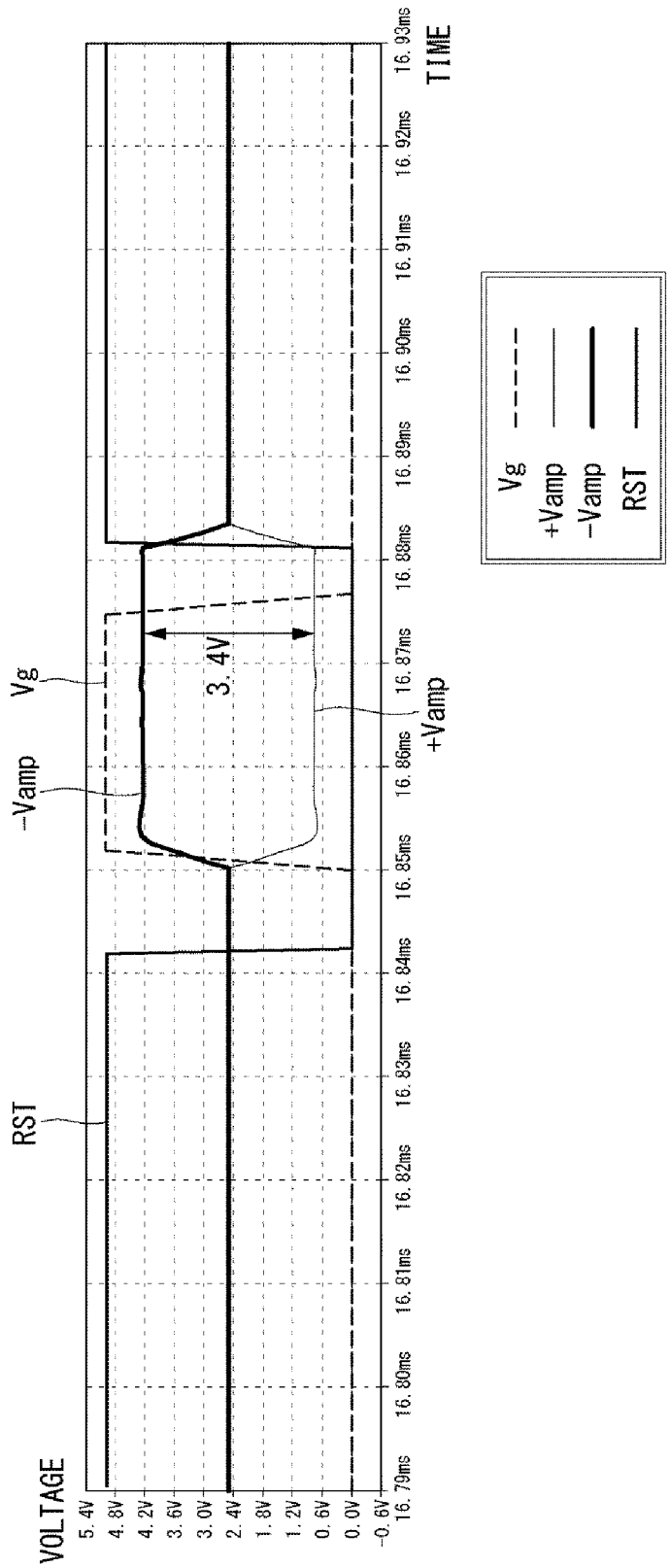
FIG. 15 is a view illustrating a simulation result of a sample (comparative example) in which one photo sensor is connected to a differential amplifier.
Figure 16:
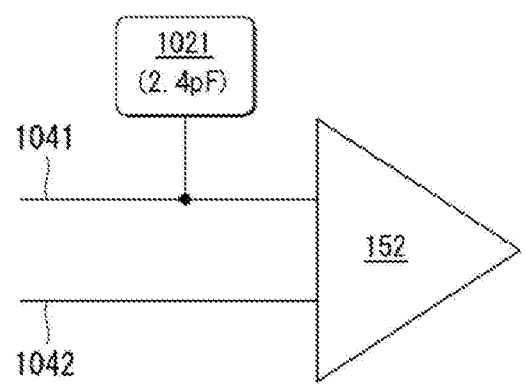
FIG. 16 is a view illustrating a differential amplifier and a photo sensor applied to the sample illustrated in FIG. 15.
Figure 17:
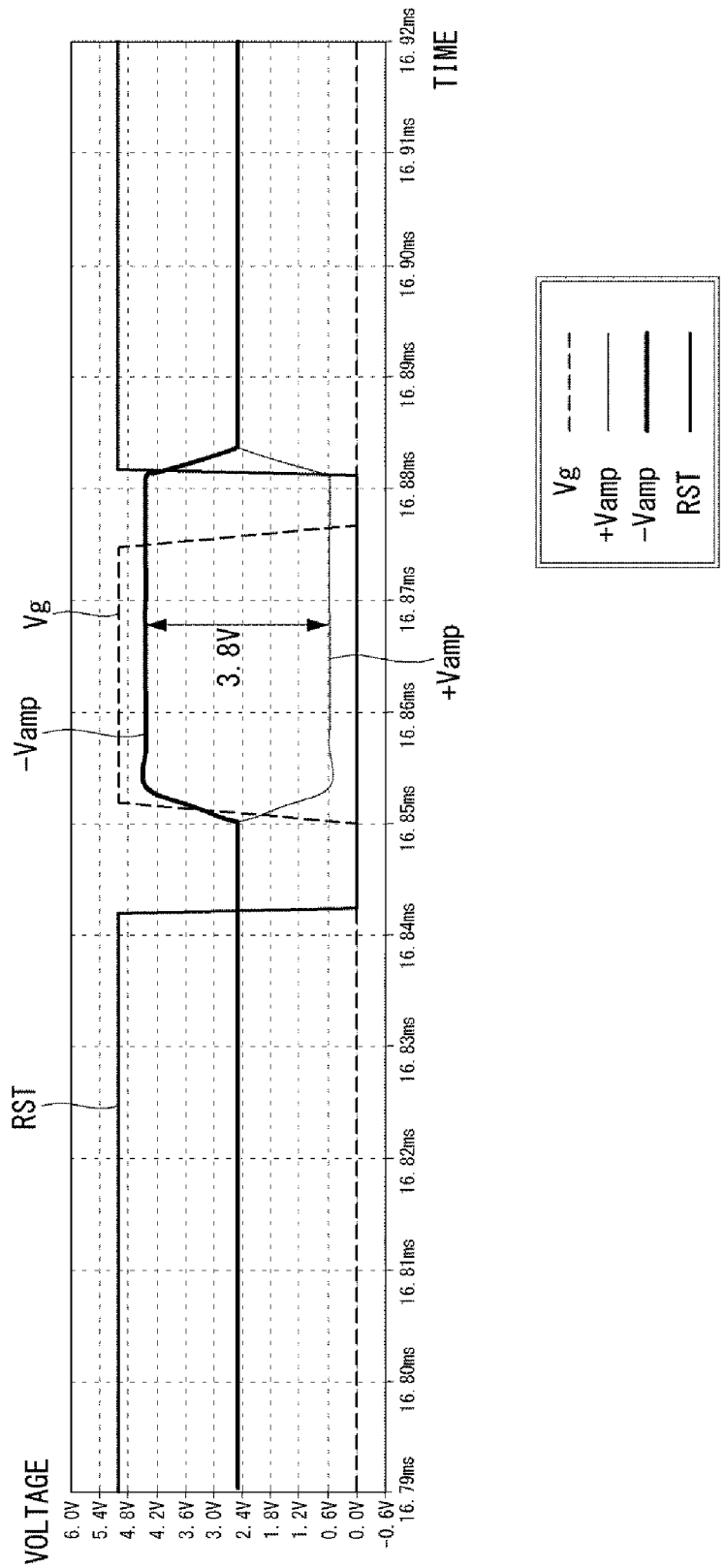
FIG. 17 is a view illustrating a simulation result of a sample in which first and second photo sensors are connected to a differential amplifier.
Figure 18:
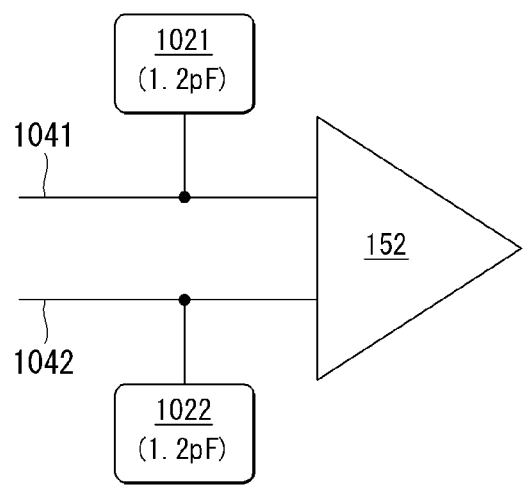
FIG. 18 is a view illustrating a differential amplifier and a photo sensor applied to the sample illustrated in FIG. 17.

FIG. 15 is a view illustrating a simulation result of a sample (comparative example) in which one photo sensor is connected to a differential amplifier as illustrated in FIG. 16. In FIG. 16, capacitance of the photo sensor 1021 is set to 2.4 [pF]. FIG. 17 is a view illustrating a simulation result of a sample in which first and second photo sensors are connected to a differential amplifier as illustrated in FIG. 16. In FIG. 18, capacitance of each of the photo sensors 1021 and 1022 is set to 1.2 [pF], which is reduced by half as compared with the sample illustrated in FIG. 17.

As can be seen from FIGS. 16 and 17, by connecting the photo sensors having different polarities to the input terminals on both sides of the differential amplifier, an output voltage (3.8 V) of the differential amplifier is increased to be larger than an output voltage (3.4 V) of comparative example and loss of the output voltage may be further reduced although the capacitor is reduced. When the capacitor is reduced, a size of the photo sensor is reduced, and thus, an aperture ratio of the pixels may be increased as much.

In the present disclosure, noise as a common mode signal may be removed by inputting signals of a first photo sensor generating a positive charge signal and a second photo sensor generating a negative charge signal to one differential amplifier and the output voltage of the amplifier may be increased by amplifying a difference voltage between the positive charge signal and the negative charge signal.

As described above, in the present disclosure, by increasing the difference between the photo sensor signal and noise, the signal-to-noise ratio (SNR) may be improved and resolution of the ADC may be enhanced.

In the present disclosure, the ratio of the unexposed sensor signal to the output voltage of the differential amplifier may be lowered by alternately arranging the first and second photo sensors at N-dot intervals.

In the present disclosure, by switching the bias voltage applied to the photo sensor at a predetermined time period between the first bias voltage and the second bias voltage, reliability and durability of the photo sensor may be enhanced and reliability and lifetime of the transistor constituting the photo sensor may be improved.

A display panel equipped with a photo sensor and a display device using the same according to various aspects of the disclosure may be described as follows.

The display panel comprises a plurality of pixels into which pixel data of an input image is written; a plurality of data lines connected to the pixels; a plurality of photo sensors sensing light; a plurality of read-out lines connected to the photo sensors; and a plurality of gate lines connected to the pixels and the photo sensors. The photo sensors comprise: at least one first photo sensor to which a first bias voltage is supplied; and at least one second photo sensor to which a second bias voltage different from the first bias voltage is supplied.

The first photo sensor is connected to a first read-out line. The second photo sensor is connected to a second read-out line. The first photo sensor and the second photo sensor neighbor each other in a horizontal direction.

A predetermined number of the first photo sensor and a predetermined number of the second photo sensor are alternately connected to the first read-out line. the first photo sensor and the second photo sensor neighbor each other in the horizontal direction.

A bias voltage applied to the first and second photo sensors is switched between the first bias voltage and the second bias voltage.

Each of the photo sensors comprises: a first transistor in an OFF state to which the first bias voltage or the second bias voltage is applied; a second transistor turned on according to a gate on voltage applied from the gate line; and a capacitor connected to a node between the first transistor and the second transistor.

Wherein +V>Vref>−V>Voff in which +V is the first bias voltage, −V is the second bias voltage, Vref is a reference voltage between the first bias voltage and the second bias voltage, and Voff is a gate voltage of the first transistor.

The capacitor comprises a first electrode connected to the node between the first transistor and the second transistor; and a second electrode to which the Voff is applied.

The display device comprises a display panel including pixels into which pixel data of an input image is written, data lines connected to the pixels, photo sensors sensing light, read-out lines connected to the photo sensors, and gate lines connected to the pixels and the photo sensors; a display panel driver writing the pixel data of the input image into the pixels; and a read-out unit connected to the read-out lines and amplifying signals from the photo sensors to convert the signals into digital data. The photo sensors comprise: at least one first photo sensor to which a first bias voltage is supplied; and at least one second photo sensor to which a second bias voltage different from the first bias voltage is supplied.

The read-out unit comprises: a differential amplifier amplifying a differential signal voltage of a first photo sensor signal and a second photo sensor signal; a sample and holder sampling an output voltage from the differential amplifier; and an analog-to-digital converter (ADC) converting a voltage from the sample and holder into the digital data.

The differential amplifier comprises: an operational amplifier including an inverting input terminal, a non-inverting input terminal, an inverting output terminal, and a non-inverting output terminal; a capacitor connected between the inverting input terminal and the non-inverting output terminal; a reset switch element connected between the inverting input terminal and the non-inverting output terminal; a capacitor connected between the non-inverting input terminal and the inverting output terminal; and a reset switch element connected between the non-inverting input terminal and the inverting output terminal.

The inverting input terminal of the differential amplifier is connected to a first read-out line. The non-inverting input terminal of the differential amplifier is connected to a second read-out line. The first read-out line is connected to at least one of the first photo sensor and the second photo sensor. The second read-out line is connected to at least one of the first photo sensor and the second photo sensor. The first photo sensor connected to the first read-out line and the second photo sensor connected to the second read-out line neighbor each other in a horizontal direction.

The inverting input terminal of the differential amplifier is connected to a first read-out line. The non-inverting input terminal of the differential amplifier is connected to a second read-out line. The first photo sensor is connected to the first read-out line. The second photo sensor is connected to the second read-out line. The first photo sensor and the second photo sensor neighbor each other in a horizontal direction.

The inverting input terminal of the differential amplifier is connected to a first read-out line. The non-inverting input terminal of the differential amplifier is connected to a second read-out line. A predetermined number of the first photo sensor and a predetermined number of the second photo sensor are alternately connected to the first read-outline. The first photo sensor and the second photo sensor neighbor each other in a horizontal direction.

A bias voltage applied to the first and second photo sensors is switched between the first bias voltage and the second bias voltage at a predetermined time period.

The read-out unit comprises: a first differential amplifier amplifying a differential signal voltage of the first photo sensor signal and the second photo sensor signal to generate an inverted output voltage and a non-inverted output voltage; a second differential amplifier amplifying a differential signal voltage between the inverted output voltage and the non-inverted output voltage to generate a single output voltage; a sample and holder sampling an output voltage from the second differential amplifier; and an analog-to-digital converter (ADC) converting a voltage from the sample and holder into the digital data.

Each of the photo sensors comprises: a first transistor in an OFF state to which the first bias voltage or the second bias voltage is applied; a second transistor turned on according to a gate on voltage applied from the gate line; and a capacitor connected to a node between the first transistor and the second transistor.

Wherein +V>Vref>−V>Voff in which +V is the first bias voltage, −V is the second bias voltage, Vref is a reference voltage between the first bias voltage and the second bias voltage, and Voff is a gate voltage of the first transistor.

Although aspects have been described with reference to a number of illustrative aspects thereof, it should be understood that numerous other modifications and aspects can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:
1. A display panel comprising:
a plurality of pixels into which pixel data of an input image is written;
a plurality of data lines connected to the plurality of pixels;
a plurality of photo sensors configured to sense light;
a plurality of read-out lines connected to the plurality of photo sensors; and
a plurality of gate lines connected to the pixels and the photo sensors,
wherein the plurality of photo sensors comprises at least one first photo sensor to which a first bias voltage is supplied and at least one second photo sensor to which a second bias voltage different from the first bias voltage is supplied, and wherein the plurality of pixels are driven during a pixel driving time interval, and the plurality of photo sensors are driven during a photo sensor driving time interval different from the pixel driving time interval, the pixel driving time interval and photo sensor driving time interval included in one frame period, wherein the first photo sensor is connected to a first read-out line, and the second photo sensor is connected to a second read-out line, wherein the first photo sensor and the second photo sensor are adjacent to each other in a horizontal direction, and wherein the first photo sensor and the second photo sensor are alternately connected to the first read-out line in at least 2-dot intervals.

2. The display panel of claim 1, wherein the first photo sensor and the second photo sensor are alternately connected to the second read-out line in the at least 2-dot intervals.

3. The display panel of claim 1, wherein the first and second photo sensors that are supplied with a bias voltage are switched between the first bias voltage and the second bias voltage.

4. The display panel of claim 1, wherein each of the photo sensors comprises:
   a first transistor in an OFF state to which the first bias voltage or the second bias voltage is applied;
   a second transistor turned on according to a gate on voltage applied from the plurality of gate lines; and
   a capacitor connected to a node between the first transistor and the second transistor,
   wherein +V>Vref>−V>Voff where +V is the first bias voltage, −V is the second bias voltage, Vref is a reference voltage between the first bias voltage and the second bias voltage, and Voff is a gate voltage of the first transistor.

5. The display panel of claim 4, wherein the capacitor comprises:
   a first electrode connected to the node between the first transistor and the second transistor; and
   a second electrode to which the Voff is applied.

6. The display panel of claim 1, further comprising a read-out unit connected to the plurality of read-out lines and amplifying signals from the plurality of photo sensors to convert the amplified signals into digital data.

7. The display panel of claim 6, wherein the read-out unit comprises:
   a differential amplifier amplifying a differential signal voltage of a first photo sensor signal and a second photo sensor signal;
   a sample and holder sampling an output voltage from the differential amplifier; and
   an analog-to-digital converter (ADC) converting a voltage from the sample and holder into the digital data.

8. The display panel of claim 7, wherein the differential amplifier comprises:
   an operational amplifier including an inverting input terminal, a non-inverting input terminal, an inverting output terminal, and a non-inverting output terminal;
   a capacitor connected between the inverting input terminal and the non-inverting output terminal;
   a reset switch element connected between the inverting input terminal and the non-inverting output terminal;
   a capacitor connected between the non-inverting input terminal and the inverting output terminal; and a reset switch element connected between the non-inverting input terminal and the inverting output terminal.

9. The display panel of claim 8, wherein the inverting input terminal of the differential amplifier is connected to a first read-out line,
   the non-inverting input terminal of the differential amplifier is connected to a second read-out line,
   the first read-out line is connected to the first photo sensor,
   the second read-out line is connected to the second photo sensor, and
   the first photo sensor connected to the first read-out line and the second photo sensor connected to the second read-out line neighbor each other in a horizontal direction.

10. The display panel of claim 8, wherein the inverting input terminal of the differential amplifier is connected to a first read-out line,
    the non-inverting input terminal of the differential amplifier is connected to a second read-out line,
    the first photo sensor is connected to the first read-out line,
    the second photo sensor is connected to the second read-out line, and
    the first photo sensor and the second photo sensor neighbor each other in a horizontal direction.

11. The display panel of claim 8, wherein the inverting input terminal of the differential amplifier is connected to a first read-out line,
    the non-inverting input terminal of the differential amplifier is connected to a second read-out line,
    a predetermined number of the first photo sensor and a predetermined number of the second photo sensor are alternately connected to the first read-outline at 3-dot intervals, and
    the first photo sensor and the second photo sensor neighbor each other in a horizontal direction.

12. A display device comprising:
    a display panel including a plurality of pixels where pixel data of an input image is written, a plurality of data lines connected to the plurality of pixels, a plurality of photo sensors sensing light, a plurality of read-out lines connected to the plurality of photo sensors, and a plurality of gate lines connected to the plurality of pixels and the plurality of photo sensors;
    a display panel driver writing the pixel data of the input image into the pixels; and
    a read-out unit connected to the plurality of read-out lines and amplifying signals from the plurality of photo sensors to convert the amplified signals into digital data,
    wherein the photo sensors comprise:
    at least one first photo sensor supplied with a first bias voltage; and
    at least one second photo sensor supplied with a second bias voltage that is different from the first bias voltage,
    wherein the plurality of pixels are driven during a pixel driving time interval, and the plurality of photo sensors are driven during a photo sensor driving time interval different from the pixel driving time interval, the pixel driving time interval and photo sensor driving time interval obtained included in one frame period,
    wherein the first photo sensor is connected to a first read-out line, and the second photo sensor is connected to a second read-out line,
    wherein the first photo sensor and the second photo sensor are adjacent to each other in a horizontal direction, and wherein the first photo sensor and the second photo sensor are alternately connected to the first read-out line in at least 2-dot intervals.

13. The display device of claim 12, wherein the read-out unit comprises:
   a differential amplifier amplifying a differential signal voltage of a first photo sensor signal and a second photo sensor signal;
   a sample and holder sampling an output voltage from the differential amplifier; and
   an analog-to-digital converter (ADC) converting a voltage from the sample and holder into the digital data.

14. The display device of claim 13, wherein the differential amplifier comprises:
   an operational amplifier including an inverting input terminal, a non-inverting input terminal, an inverting output terminal, and a non-inverting output terminal;
   a capacitor connected between the inverting input terminal and the non-inverting output terminal;
   a reset switch element connected between the inverting input terminal and the non-inverting output terminal;
   a capacitor connected between the non-inverting input terminal and the inverting output terminal; and
   a reset switch element connected between the non-inverting input terminal and the inverting output terminal.

15. The display device of claim 14, wherein the inverting input terminal of the differential amplifier is connected to a first read-out line,
   the non-inverting input terminal of the differential amplifier is connected to a second read-out line,
   the first read-out line is connected to the first photo sensor,
   the second read-out line is connected to the second photo sensor, and
   the first photo sensor connected to the first read-out line and the second photo sensor connected to the second read-out line neighbor each other in a horizontal direction.

16. The display device of claim 14, wherein the inverting input terminal of the differential amplifier is connected to a first read-out line,
   the non-inverting input terminal of the differential amplifier is connected to a second read-out line,
   the first photo sensor is connected to the first read-out line,
   the second photo sensor is connected to the second read-out line, and
   the first photo sensor and the second photo sensor neighbor each other in a horizontal direction.

17. The display device of claim 14, wherein the inverting input terminal of the differential amplifier is connected to a first read-out line,
   the non-inverting input terminal of the differential amplifier is connected to a second read-out line,
   a predetermined number of the first photo sensor and a predetermined number of the second photo sensor are alternately connected to the first read-outline at 3-dot intervals, and
   the first photo sensor and the second photo sensor neighbor each other in a horizontal direction.

18. The display device of claim 12, wherein the read-out unit comprises:
   a first differential amplifier amplifying a differential signal voltage of a first photo sensor signal and a second photo sensor signal to generate an inverted output voltage and a non-inverted output voltage;
   a second differential amplifier amplifying a differential signal voltage between the inverted output voltage and the non-inverted output voltage to generate a single output voltage;
   a sample and holder sampling an output voltage from the second differential amplifier; and
   an analog-to-digital converter (ADC) converting a voltage from the sample and holder into the digital data.

19. The display device of claim 12, wherein each of the photo sensors comprises:
   a first transistor in an OFF state to which the first bias voltage or the second bias voltage is applied;
   a second transistor turned on according to a gate on voltage applied from the gate line; and
   a capacitor connected to a node between the first transistor and the second transistor,
   wherein +V>Vref>−V>Voff where +V is the first bias voltage, −V is the second bias voltage, Vref is a reference voltage between the first bias voltage and the second bias voltage, and Voff is a gate voltage of the first transistor.

20. The display panel of claim 12, wherein the first photo sensor and the second photo sensor are alternately connected to the second read-out line in the at least 2-dot intervals.

* * * * *